United States Patent
Potapov et al.

(10) Patent No.: US 7,295,006 B2
(45) Date of Patent: Nov. 13, 2007

(54) METHOD FOR MEASURING NUCLEAR MAGNETIC RESONANCE LONGITUDINAL AXIS RELAXATION TIME OF BLOOD AND APPARATUS USING THE SAME

(75) Inventors: Sergey Potapov, Suwon-si (KR); Jong-hwa Won, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 21 days.

(21) Appl. No.: 11/408,090

(22) Filed: Apr. 21, 2006

(65) Prior Publication Data

US 2007/0035296 A1  Feb. 15, 2007

(30) Foreign Application Priority Data

May 3, 2005  (KR) .................. 10-2005-0037100

(51) Int. Cl.
*G01V 3/00* (2006.01)
(52) U.S. Cl. .................. 324/306; 324/309; 600/419
(58) Field of Classification Search .............. 324/306, 324/307, 309; 600/419
See application file for complete search history.

(56) References Cited

U.S. PATENT DOCUMENTS

| 5,335,660 A | * | 8/1994 | Dumoulin | 600/419 |
| 5,363,042 A | * | 11/1994 | Dumoulin | 324/306 |
| 2004/0162483 A1 | * | 8/2004 | Kimura | 600/419 |

* cited by examiner

*Primary Examiner*—Louis M. Arana
(74) *Attorney, Agent, or Firm*—Sughrue Mion Pllc.

(57) ABSTRACT

Disclosed are a method and apparatus for accurately measuring nuclear magnetic resonance (NMR) longitudinal axis relaxation time by minimizing the influence of the amount of blood. The method includes applying a first magnetic field $M_O$ to a living body portion into which the blood flows magnetizing the blood in a first direction; applying a second magnetic field $M_Z$ to at least a portion of the living body portion, to which the first magnetic field $M_O$ is applied, magnetizing at least a portion of the blood in a second direction vertical to the first direction;; blocking $M_Z$ detecting a signal that is induced as magnetization is returned from the second direction to the first direction; detecting the amount of blood to which the second magnetic field $M_Z$ is applied; and calculating the longitudinal axis relaxation time $T1$ of the blood based on the induced signal and based on the amount of blood.

17 Claims, 5 Drawing Sheets

ARTERY        FINGER TIP         VEIN
              CAPILLARY

ARTERY          FINGER TIP CAPILLARY          VEIN

METHOD FOR MEASURING NUCLEAR MAGNETIC RESONANCE LONGITUDINAL AXIS RELAXATION TIME OF BLOOD AND APPARATUS USING THE SAME

CROSS-REFERENCE TO RELATED APPLICATIONS

This application claims benefit under 35 U.S.C. § 119 from Korean Patent Application No. 2005-37100, filed on May 3, 2005, the entire content of which is incorporated herein by reference.

BACKGROUND OF THE INVENTION

1. Field of the Invention

The present invention relates to a method and apparatus for measuring blood nuclear magnetic resonance (NMR) longitudinal axis relaxation time, and more particularly, to a method and apparatus capable of more accurately measuring NMR longitudinal axis relaxation time by minimizing the influence of the amount of blood.

2. Description of the Related Art

In the medical field, NMR imaging systems and NMR spectrometers for diagnosis have been used for a long time. These imaging systems and spectrometers can specifically describe the structure of a living organism and/or the structure of an organ in real time (Hinshaw et al. Display of Cross-Sectional Anatomy by Nuclear Magnetic Resonance Imaging. Brit. J. Radiol., 51: 273 (1978)., Edelstein et al. Spin Warp NMR Imaging and Applications to Human Whole-Body Imaging. Phys. Med. Biol., 25(4): 751-6 (1980)., Crooks et al. Nuclear Magnetic Resonance Whole-Body Imager Operating at 3.5 kGauss. Radiology, 143(1): 169-174 (1982).). These descriptions can be used to study a change in or a present condition of a body. Even though there is a structural change or an anatomic change, a change in image contrast can be tracked using a special chemical control reagent. Such a contrast change may occur as a natural result. A change in a function often occurs prior to a structural change or morphological change. This leads to a change in a chemical reaction rate and metabolic activity of a tissue with disease and, in turn, affects water proton relaxation time and NMR image contrast. This scheme is particularly useful for diagnosing diseases and other medical conditions, such as cancer or inflammation. Multiple sources verify that such information is very useful in the medical field (T. Araki, T. Inouye, T. Motazaki and M. Iio, *Proceedings of the 2nd Annual Meeting of the Society of Magnetic Resonance in Medicine*, Berkeley, Calif., 1983, pp. 3-4; C. J. G. Bakker and J. Vriend, *Phys. Med. Biol.,* 28, 331, 1983; L. E. Barroilhet and P. R. Moran, *Med. Phys.* 2, 191, 1975; P. T. Beall, *Magn. Reson. Imag.* 1, 189, 1982; P. T. Beall, et al. *J. Natl. Cancer Inst.,* 64, 335 1980; P. S. Belton, R. R. Jackson and K. J. Packer, *Biochim. Biophys. Acta.,* 286, 16, 1972; D. R. Bailes et al., *Clin. Radiolog.,* 33, 395, 1982). A typical NMR imaging apparatus provides information about the amount of water present in different tissues of a body or organs. Qualitatively, the apparatus provides a relaxation rate through image contrast. The use of additional hardware and software provides more accurate data of the relaxation rate. However, this additional capability has an associated increase in cost. An NMR imaging apparatus is expensive and needs skilled engineers and special infrastructure for installation and operation. Due to all these factors, the apparatus has been used only in large hospitals or medical centers.

It is well known that the relaxation time is useful as a critical diagnostic factor in medical diagnosis. Relaxation time in organism tissue was originally studied a long time ago. Many of the studies have been performed on numerous types of animal tissues and on human body tissues.

The relaxation time was initially studied by Odelblad, et al. in the late 1950's (E. Odelblad and G. Lindstrom, *Acta Radiol.* 43, 469, 1955; E. Odelblad and U. Bryhn, *Acta Radiiol.,* 47, 315 1957; E. Odelblad and B. Westin, *Acta Radiol.,* 49, 389, 1958). Damadian disclosed a study on elevated relaxation time of cancer patients (R. Damadian, *Science,* 171, 1151 1971). In 1975, Eggleston et al. disclosed a change in relaxation time in a number of diseased tissues (J. C. Eggleston, L. A. Saryan and D. P. Hollis, *Cancer Res.,* 35, 1326 1975). This marked a beginning of studies in the field of NMR imaging systems, which has developed into NMR imaging and spectrum techniques actually used for medical treatment.

It was initially difficult to discover the regularity of relaxation time in the same species. This is because there are differences between schemes and calculating ways used by several researchers and between sample measuring and processing conditions. External physical factors, such as resonance frequency, temperature, and fabrication and storing conditions for in vitro samples, significantly affect the data. It was found that dependency of the relaxation time on the frequency is correlated with rotational time of a protein molecule. This rotational time of the protein molecule determines relaxation time of an adjacent water molecule. The relaxation time of water in a tissue was observed to depend on a temperature change because the dynamic structure of water in an organism is sensitive to temperature. Clearly, relaxation times should be compared to each other at the same frequency and temperature for each sample in order to use relaxation time as an identification factor. In addition, a sample fabricating and storing method should be finely controlled and standardized to obtain a value of a tissue number that is reproducible and can be compared with respect to the relaxation time.

It was found that observed relaxation time depends on a measuring method used in an experiment. This is because relaxation generally has a multi-exponential characteristic in a heterogeneous organism tissue. When an inversion recovery pulse sequence is used for relaxation time measurement, approximation such as a null method, a 1/e method, initial rate approximation, and a single exponential fitting method may be used to calculate the relaxation time. All of these schemes result in a somewhat different relaxation time. Therefore, a consistent relaxation time calculation method, as well as temperature and frequency, is needed for the comparison of the relaxation time in the experiment.

Most studies on relaxation time behavior in an organism tissue were conducted within a test tube. As the study in this field is standardized to some extent and as data and statistics are accumulated, knowledge and standardized methods develop (P. A. Bottomley. T. H. Foster, R. E. Argersinger, L. M. Pfeifer, Med. Phys. 11 (4), July/August 1984, G. B. Friedmann, Magnetic Resonance Review 6, 4, 247-307 (1981)). It was found that the relaxation time of a number of species and types of tissues is a function of an NMR frequency, temperature, in vivo to in vitro, and time and age of extraction. It was found that the relaxation time is mainly affected by the NMR frequency and the tissue type.

The tissue frequency change may be represented by the following Equation:

$$T_1 = Av^{-B}, \qquad \text{Equation 1}$$

where A and B are tissue dependent constants at frequencies of 1-100 MHz, $T_1$ is longitudinal axis relaxation time, and v is an angular frequency. $T_2$ is a multiple-element. Transverse axis proton NMR relaxation time, $T_2$, was found to be essentially independent of the NMR frequency and to mainly depend on the type of tissue.

In the 1980's, much attention was concentrated on studies about relaxation time behavior in pathology and disease fields. Accumulated experience and results in these fields provide some information to actual medical treatment.

In most pathology, for example different types of cancers, it was observed that the tissue relaxation time is significantly increased. In a study by bottomley et al., authors checked, analyzed and summarized longitudinal axis $T_1$ and transverse axis $T_2$ proton NMR relaxation time of pathological human and animal tissue at 1-100 MHz, which is a function of tissue genesis, NMR frequency, temperature, species, and an in vivo to in vitro state. $T_1$ data of bone, brain, breast, kidney, liver, muscle, pancreas and spleen at a specific disease state may be simply represented by $T_1=Av^{-B}$ at 1-100 MHz, where A and B are pathology dependent constants which are experimentally determined and v is frequency. The pathological $T_2$ tissue value is essentially independent of the NMR frequency. When the tissue value is independent as a result of statistical analysis of the relaxation data, it was revealed that the T1 value of most tumor and edema tissue and the $T_2$ value of breast, liver and muscle tumor have increased compared to a normal value, but is not significantly different from other tumor and pathology.

A series of small tissue piece samples were stereotactically extracted from patients with glial brain tumors. Some tissue factors (water content, specific gravity of dried tissue, electrical impedance, histopathological and cytological tissue examination) of each sample were measured, and associated with NMR relaxation time of each sample. Thirty-two samples of human brain tumor were used for this measurement. The result is as follows. The longitudinal axis and transverse axis relaxation time, water content and dried tissue specific gravity of the brain tumor samples were significantly increased but the electrical impedance was reduced. There was no noticeable correlation between the relaxation time and the pathological diagnosis. However, it was found from a single analysis case that the piece sample of the tumor had a linear relationship between the longitudinal axis relaxation time and the water content. As the slope of the relationship increases, the malignant of the tumor increases. The structural change of a tumor cell giant molecule (nucleic acid and protein) can be predicted from the increases of both the water content and a dried tissue ratio in the tumor tissue (P. A. bottomley, C. J. Hardy, R. E. Argersinger, G. Allen-Moore, Medical Physics 14, no. 1, 1-37, January ?February 1987.).

This finding is very important. If there is a change in the structure and function of a biologic giant molecule as the disease proceeds, it means that there is great possibility that the change may be reflected to a change in the relaxation time. It can be predicted that cancer or malignant disease as well as edema have such an effect. There are a number of documents verifying such predictions. For example, Papish et al. tracked longitudinal axis and transverse axis relaxation time levels of serum of 197 healthy persons, 180 patients having no malignant tumor history, and 345 cancer patients having tumor at different portions. These factors are not related with sex or age of the patients. The relaxation time value of the cancer patients was greater than the patients having no tumor and much greater than the healthy persons' relaxation time value. On average, the patients having no tumor exhibited an increased longitudinal axis relaxation time of 0.17s compared to the healthy persons, and the patients having tumor exhibited an increase by 0.27 s (E. A. Papish, T. Y. Tyomkina, N. F. Karyakina, Meditsinskaya Radiologiya vol.33, no.8: 47-50, August 1988.).

A second group of 180 patients had different diseases such as tuberculosis, gastric ulcer, gastritis and fibrous tumor. Only malignant diseases do not increase the relaxation time. The relaxation time change can be tracked through a study on an organ tissue with disease or a study on liquid that is common to all organisms. Such liquids are blood and lymph. Referring to the references, it can be seen that a change in the relaxation time of blood and blood plasma has been studied, and that relaxation time is typically increased in a number of histopathological cases (Supra, G. B. Friedmann, Magnetic Resonance Review 6, 4, 247-307 (1981), E. A. Papish, T. Y. Tyomkina, N. F. Karyakina, Meditsinskaya Radiologiya vol.33, no.8: 47-50, August 1988, O. P. Revokatov, M. G. Gangardt, V. V. Murashko, A. K. Zhuravlev, Biofizika v.27, no 2, 336-338, 1982, A. Koivula, K. Suominen, T. Timonen, K. Kiviniitty, Physics in Medicine and Biology v. 27, no. 7, 937-947, July 1982.).). In a study by Revokatov et al. spin-lattice and spin-spin relaxation time, and a self-diffusion coefficient of water molecule in serum and blood plasma of healthy persons, patients with disease other than cancer, and cancer patients have been measured and results thereof have been reported (Supra, Revokatov). The results show that the measurement of longitudinal axis relaxation time of the serum may be used as a fast and massive cancer disease diagnosis method.

In a study by Koivula et al., a blood component that affects longitudinal axis NMR relaxation time of protons of water in a malignant blood disease was investigated and 55 blood samples were studied (the samples come from 20 healthy persons and 35 leukemia, myelofibrosis and multiple myeloma patients). The relaxation time measurement was conducted at a resonance frequency of 19.8 MHz and a temperature of 33±1° C. The relaxation time elevated over a normal level appeared in entire blood, packed cell, and blood plasma of the patients with blood disease. This relaxation rate depends on a ratio of dried solid to water. This corresponds to a three-state fast-exchange relaxation model (Supra, Koivula).

It could be concluded from the Denis study and related documents that the relaxation time is increased in tissues and in organism body fluids, particularly blood, affected by different diseases Typically, interstitial fluid is closely contiguous to all of these body fluids and its composition thereof is almost that of blood plasma. The change of blood plasma relaxation time is expected to be reflected to the interstitial fluid to some extent. This change may be tracked at all positions of the organism.

An NMR imaging apparatus and a relaxometer have not been widely used in organ diagnosis because of costs and complexity. However, this situation is changing in recent years. A compact and inexpensive NMR apparatus has been invented and disclosed. For example, such an apparatus is disclosed in U.S. Pat. Nos. 4,875,486 and 6,404,197B1. These patents provide an apparatus for noninvasive spectral measurement for dextrose content of blood. These methods are not used in a medical field because chemical components of the blood affect one another on the NMR spectrum of the blood. However, the inventions may provide a small-sized NMR apparatus for users and doctors. Recently, a small-sized NMR relaxometer is disclosed in Russian Patent RU 33235 U1. This patent discloses the design and principle of a compact magnet relaxometer. This relaxometer is intended to measure longitudinal axis relaxation time of in vitro blood and of in vivo finger tissue. In studies by Protasov et al. and Esicov, these patents revealed that blood relaxation time linearly depends on dextrose concentration. They found that relaxation time measured by the NMR relaxometer after food ingestion is increased with time, and there is a correlation between the time and blood dextrose content. It can be seen from the data that blood relaxation time $T_1$ changes from 0.6 s to 1 s when the dextrose concentration is changed from 4 to 12 mmol/L.

The same linear dependency appeared when the relaxation time of the finger tissue, other than the blood sample, was measured. In this case, however, the change in the relaxation time was much smaller, 0.33 s-0.48 s, and was within the same range of the dextrose concentration (Protasov E. A., Esikov O. S., Karpova E. S. Measurement of concentration of glucose in human blood by NMR method. Scientific conf. MEPhI-2003, v. 5, p. 38., Esicov O. S., Protasov E. A. Magneto-resonant method of measurement of spin-lattice relaxation time on the base of the size of absorption signal. Scientific conf. MEPhI-2003, v. 4, p. 46.). This could be explained by the fact that the dextrose concentration in a tissue cell is very small but an amount of blood and interstitial fluid proportional to all finger tissues are approximately 30%. This assumption is not yet verified and the dextrose selectivity of this sensor is under study. Such an increase in the relaxation time may be caused by an increase in blood metabolism after food ingestion. An experiment in which dextrose is added to a blood sample hardly exhibits the increase in the relaxation time. A final conclusion or explanation as to an accurate mechanism affecting the spin-lattice relaxation time of the blood and tissue during a day's period and in the case of disease is not yet obtained, but it is desirable that the relaxation time of peripheral tissues is independent of the relaxation time of only independent blood to increase effects of this factor.

A state of water within an organism tissue can be easily changed by chemical organic process. This phenomenon leads to relaxation time sensitive to an abnormal state of water in a cell and body fluids of a tissue. A number of abnormal states and a pathological processes may affect the state of the water molecule in the cell. This complicates attempts to use the relaxation time as an identification factor in medical diagnosis. However, complications need to be considered from alternative view points When most of the pathology states and abnormal processes of the tissue that change cell metabolism affect the relaxation time, the relaxation time may be used as a kind of universal factor characterizing a cell state.

The same situation is applied to the blood. Blood is a universal body fluid of all organisms and tissues. An organism exchanges a number of chemical components with blood. If disease or food ingestion increases the exchange process in an organism, this is reflected to the relaxation time behavior of the blood. Blood metabolism is low and relaxation time is short at during relatively quiet state, for example, night or between food ingestions. Food ingestion promotes a significant increase in the exchange process and increases metabolism. This leads to increases in the blood relaxation time. When an organ of an organism has a disease, a metabolism process is higher than the healthy state because the organ with disease does not work at an optimal state. This organ has an increased metabolism process. In this case, increase in the blood relaxation time may be sensed but it is less than the increase associated with food ingestion. A difference between these increases is that for food ingestion, the relaxation time is returned to a normal minimum relaxation time level after 3 or 4 hours, while for disease, this elevated relaxation time persists.

A blood metabolism rate is affected by a physical load, an oxygen load, food ingestion, a pH state, a disease and other elements. Relaxation time behavior is also independent to some extent. There is also universal regularity. The recovery rate of the blood relaxation time indicates an organism's capability against a physical load of a disease and shows efficiency of a nutrition process. This element can be used to study a day's period of blood metabolism rate and the stability of an organism state under several situations. This information is very useful for science and organ prediction.

A nutrition state of a metabolism process in a body may be classified into two states of an absorption state and a post-absorption state. The absorption state is a state during ingestion and post-ingestion. During this state, food is digested and absorbed. In 24 hours of a day's period, the absorption state is kept during a first 12 hours and a post-absorption state is kept during a second 12 hours. In three mealtimes of a day period, the absorption occurs early morning, each mealtime, and four hours after each mealtime. During the mealtime or after the mealtime, several types of metabolites such as salt, acid, dextrose, amino acid, enzyme, and hormone flow into the blood. All of these components should be transferred to tissue cells. The main transfer action in the blood plasma is served by albumin protein. The capability of this protein to combine and transfer these metabolites is highly effective. It is well known that the protein capability of combining different components significantly depends on solution factors such as pH and ionic force. These factors are all changed during the absorption state. This increases the capability of the protein molecules to combine metabolites. Physically, this means that a change occurs in a surface charge distribution on a protein molecule. Protein molecule conformation and charge dispersion on the protein molecule surface significantly affects the structure and thickness of a hydration shell of combined water molecules. This results in the dependency of spin diffusion, proton exchange, and magnetization transfer between a water molecule and a protein molecule. Basically, enhanced combining capability of a protein molecule to nutrient means reduction of chemical attraction to water molecule. Hydrogen combination intensity and the thickness of a combined water layer are reduced. All of theses factors lead to the increase in longitudinal axis relaxation time of water molecule within blood. The same process may be found in disease. An organ with disease requires an increase in metabolism rate. This is because cell operation at a pathology state is not maximized and quick exchange and energy consumption is needed.

This problem may be addressed from the most general theory standpoint. All processes within living organisms proceed in a water-based medium. Water is a liquid having high polarity and has a unique inherent nature. All giant biologic molecules "operate" in this medium, and interaction of the giant biologic molecules with water molecules determines their nature and operation. Factors such as pH and ionic force most importantly affect processes in the biologic tissue and body fluids. Combination of a water molecule with protein, proton exchange and magnetization transfer rate, and cross relaxation rate depend on these factors, as well. Hydrogen nucleus assembly of blood may be regarded as an open linear system. The open nonlinear system exchanges mass and energy with other systems. The rate of a physical chemistry process in the blood directly affects the structure and symmetry of water molecules around protein in this mixture solution, and affects entropy of this system. The rate of the metabolism process changes during a day. This means that there is a period having low metabolism activity and a period having high metabolism activity.

Food or drink ingestion means that metabolism activity for blood increases. Movement of nutrient through an organism may be regarded as additional dispersion of materials and energy. If more materials or chemical components move through the blood, a load on the transfer and exchange system increases. This process has a very detailed and minute adjustment mechanism. However, generally speaking, this additional load increases a chaotic state of water molecules and leads to less symmetry of a water shell around a biologic transfer molecule. The combination intensity or degree of immobilization of the water molecule and the structure of a water shell around a giant molecule are changed when the metabolism rate increases. This is reflected to the change in the relaxation rate.

In a biologic organism, a main mechanism of the NMR relaxation is dipole-dipole relaxation. From the NMR theory, the relaxation rate is represented as follows:

$$\frac{1}{T_1} = J(\omega) + J(2\omega), \text{ and} \quad \text{Equation 2}$$

$$\frac{1}{T_2} = J(0) + J(\omega) + J(2\omega), \quad \text{Equation 3}$$

where, $J(\omega)$ is a spectrum density function of spin rotation. This is an index of power portion at a frequency $\omega$. Water molecules at a liquid state have very short rotational, correlation on the order of $10^{-11}$s. Biologic molecules have greater correlation time. Particularly, large protein molecules have correlation times of $10^{-9}$ or $10^{-7}$ s. If the NMR relaxometer sensor uses a frequency of several tens of MHz, then giant biologic molecules have a much greater spectrum density fiction than that of water molecules at this frequency. This result indicates that the protons of these molecules relax much faster. The protons of these molecules relax at in a higher speed than that of water molecules within a solution containing protein and other biologic giant molecules because of their interaction with the water molecules. In this process, the protein greatly contributes to the relaxation and immobilizes the water molecules to some extent. In this regard, there is always some symmetry or regularity, particularly, around the giant biologic molecules and the protein in the mixture solution. From detailed observation of the transfer and action of the protein and metabolite, it is apparent that an increase in metabolism activity means that the protein is closely related to molecule movement and the exchange process. This necessarily reduces at least a protein-water combination degree in a special molecule position, and reduces the regularity and symmetry of water shell around the protein. Water molecule immobilization is also reduced. However, all these processes lead to reduced spin transfer and cross relaxation between water and protein molecules and increased transverse axis and longitudinal axis relaxation time. It will be apparent from consideration of these facts that relaxation time is increased each time a load is applied to a transfer system and a metabolism system. Food ingestion may be regarded as an additional load. The same applies to an abnormal or destructive process in the organism. Severe disease of an organ or organism may be an additional load on the transfer system and the metabolism activity. Accordingly, it can be found that a number of diseases increase the relaxation time of the blood. Myelofibrosis and multiple myeloma or blood diseases, such as leukemia, increase the relaxation time of the blood (Supra, Koivula). Such consideration is fundamental and not yet detailed. Nevertheless, it helps to basically describe blood relaxation time behavior in pathology. The only disease reducing the relaxation time is a red blood corpuscle disease called hemolytic anemia, in which a Hienz antibody attached to a cell film is formed within a cell, which is denaturalized and extracted hemoglobin (Hb) (M. Sogami, N. Uyesaka, S. Era, and K. Kato. NMR in Biomedicene, 16, 19-28, 2003.). It is a common phenomenon that oxyhemoglobin is automatically oxidized into paramagnetic met-hemoglobin (Met-Hb) and is accelerated in Hienz antibodies that form red blood cells (RBC). It is well known that a paramagnetic ion significantly reduces $T_1$ and $T_2$ of water. It is also well known that a free radical has a paramagnetic nature and a very small amount of free radical significantly reduces the relaxation time. The free radical adversely affects the organism, and increases concentration within the organism only in some special situations. Consequently, this situation may be sensed by the NMR relaxometer sensor. It may be uncommon that diseases having opposite tendency with respect to the relaxation time simultaneously occur in the same organism. It can be concluded that control of the relaxation time of the blood serves as a diagnosis factor useful in the medical field and is more valuable as a universal sensor that affords early prediction of an organism in a diseased state. In addition, this sensor may be used to scientifically study a response of a metabolism system to different types of loads applied on the organism.

It will be apparent from the above discussion that the metabolism process directly affects NMR relaxation mechanism of the water molecule and increases the relaxation time. Actually, this process can be directly observed. It is known that longitudinal axis relaxation of the blood after food ingestion is increased in all cases. The same effect is obtained in a severe organism condition. It is already recognized from experiments that almost all normal processes in an organic system and an inorganic system have an optimal factor characterizing the processes. One of the most universal principles in nature is a minimum-operation principle. It is logical that evolved biologic organisms try to develop a metabolism system so that a transfer and exchange process has a possible minimum value in a minimum activity state. This is a rest state of the organism. In the case of a physical load such as disease or food ingestion, the metabolism system is activated and all metabolism processes are accelerated. This naturally requires additional energy consumption. In this approach, the factor called the blood relaxation time may be used to study a response of the metabolism system of the organism to different types of loads, for example to study a response of an organism to a load in a sportsman training program. This approach may also be used by doctors to study features of a disease recovery process. This approach may also be used for all persons to perform medical diagnosis using universal equipment. This equipment could be advantageously applied to diagnosis means of a healthy room. U. S. Departments of Health and Human Services have recently approved a standard test that exhibits dextrose metabolism. This test is conducted by tracking valid time of detecting C13 isotope from exhalation. The valid time of this test may be somewhat associated with recovery of increased relaxation time of blood. This is because that the factor is also directly related to the blood and tissue metabolism.

Noninvasive measurement of only blood spin-lattice relaxation time is critical. This is because a relative change upon measurement of relaxation time of blood and peripheral tissue is much smaller and may be affected by a state of peripheral tissue (as well as a blood state) and also by surface paramagnetic contamination. Therefore, it is very important to separate only blood relaxation time, which is not affected by peripheral environment.

SUMMARY OF THE INVENTION

Accordingly, it is an aspect of the present invention to provide a method and apparatus capable of more accurately measuring NMR longitudinal axis relaxation time by minimizing influence from a change in a blood amount.

The above aspect of the present invention is substantially realized by providing a method for measuring NMR longitudinal axis relaxation time, $T_1$, of blood, the method comprising: applying a first magnetic field $M_O$ to a living body portion into which the blood flows in order to magnetize the blood in a first direction; applying a second magnetic field $M_Z$ to at least a portion of the living body portion, to which the first magnetic field $M_O$ is applied, in order to magnetize at least a portion of the blood that flows in the first direction, in a second direction vertical to the first direction; controlling application of the second magnetic field $M_Z$; when the second magnetic field $M_Z$ is blocked, detecting a signal that is induced as magnetization is returned from the second direction to the first direction; detecting an amount of the blood flowing into the living body portion to which the second magnetic field $M_Z$ is applied; and calculating the longitudinal axis relaxation time $T_1$ of the blood based on the induced signal and the blood amount to reduce influence of the blood amount on the longitudinal axis relaxation time of the blood.

According to an exemplary embodiment, the method may further comprise the step of immobilizing the living body portion to prevent movement thereof.

According to another exemplary embodiment, the nuclear magnetic resonance may be hydrogen NMR (H NMR).

According to another exemplary embodiment, the step of applying the second magnetic field $M_Z$ may comprise the steps of: generating high-frequency current; generating low-frequency current; multiplexing the generated high-frequency current by the low-frequency current; and supplying the resultant current to a coil, the coil being magnetically connected with a living body portion to which the second magnetic field is to be applied, wherein: the control step controls application of current to the coil, the step of detecting the induced signal comprises the steps of filtering a signal induced from the coil to obtain a low-frequency component signal, and amplifying the obtained low-frequency component signal, and the amplified signal is used as the induced signal that is used in the step of calculating the longitudinal axis relaxation time $T_1$ of the blood.

According to another exemplary embodiment, the control step may further comprise the step of controlling the frequency of the high-frequency current and the low-frequency current.

According to another exemplary embodiment, the living body portion may be a finger of a human body.

According to an exemplary embodiment, the blood amount may be an amount of blood flowing into a capillary vessel system of the finger tip.

According to an exemplary embodiment, the step of calculating the nuclear magnetic longitudinal axis relaxation time $T_1$ of the blood may calculate the nuclear magnetic longitudinal axis relaxation time $T_1$ of the blood by the following Equation:

$$A'(t) = \frac{(kR'(t)+q)C_2}{kR(t)} + \frac{C_1 - A}{T_1},$$

where A(t) is the detected induced signal, A'(t) is a derivative of A(t), R(t) is the detected blood amount, R'(t) is a derivative of R(t), $T_1$ is the nuclear magnetic longitudinal axis relaxation time of the blood, and k, $C_1$, $C_2$, q are constants.

According to an exemplary embodiment, the step of calculating the nuclear magnetic longitudinal axis relaxation time $T_1$ of the blood may calculate the nuclear magnetic longitudinal axis relaxation time $T_1$ of the blood by the following Equation:

$$A'(t) = f_1(R(t), R'(t), q, C_1, C_2, \ldots ) + f_2(A(t), T_1, C_3, C_4, \ldots ) + g_i,$$

where A(t) is the detected induced signal, A'(t) is a derivative of A(t), R(t) is the detected blood amount, R'(t) is a derivative of R(t), $T_1$ is the nuclear magnetic longitudinal axis relaxation time of the blood, k, q, $C_1$, $C_2$, $C_3$, $C_4$, ... are constants, and $g_i$ is an accidental error.

In accordance with another aspect of the present invention, there is provided an apparatus for measuring nuclear magnetic resonance (NMR) longitudinal axis relaxation time $T_1$ of blood, the apparatus comprising: a first magnetic field $M_O$ supplying unit for applying a first magnetic field $M_O$ to a living body portion into which the blood flows in order to magnetize the blood in a first direction; a second magnetic field supplying unit for applying a second magnetic field $M_Z$ to at least a portion of the living body portion, to which the first magnetic field $M_O$ is applied, in order to magnetize at least a portion of the blood that flows in the first direction, in a second direction vertical to the first direction; a controller for controlling application of the second magnetic field $M_Z$; an induced-signal detector for, when the second magnetic field $M_Z$ is blocked, detecting a signal that is induced as magnetization is returned from the second direction to the first direction; a blood amount detector for detecting an amount of the blood flowing into the living body portion to which the second magnetic field $M_Z$ is applied; and a calculating unit for calculating the longitudinal axis relaxation time $T_1$ of the blood based on the induced signal and the blood amount to reduce influence of the blood amount on the longitudinal axis relaxation time of the blood.

According to another exemplary embodiment, the apparatus further comprises an immobilization unit for immobilizing the living body to prevent movement thereof.

According to another exemplary embodiment, the immobilization unit comprises a guide for guiding the finger and an air pumped finger holder for immobilizing a tip of the finger.

According to another exemplary embodiment, the second magnetic field $M_Z$ supplying unit comprises a high-frequency current generator, a low-frequency current generator, and a multiplier for multiplying the generated high-frequency current by the low-frequency current, the coil receives a signal from the multiplier to generate the second magnetic field, the controller controls application of current to the coil, the induced-signal detector comprises a low pass filter for receiving an induced signal from the coil and filtering the induced signal to obtain a low-frequency component signal, and an amplifier for amplifying the detected low-frequency component signal, and an output signal from the amplifier is input to the calculating unit calculating the longitudinal axis relaxation time $T_1$ of the blood.

According to another exemplary embodiment, the living body portion may be a finger of a human body.

According to another exemplary embodiment, the blood amount may be an amount of blood flowing into a capillary vessel system of the finger tip.

According to another exemplary embodiment, the calculating unit may calculate the nuclear magnetic longitudinal axis relaxation time $T_1$ of the blood by the following Equation:

$$A'(t) = \frac{(kR'(t)+q)C_1 - qC_2}{kR(t)} + \frac{C_1 - A}{T_1},$$

where A(t) is the detected induced signal, A'(t) is a derivative of A(t), R(t) is the detected blood amount, R'(t) is a derivative of R(t), $T_1$ is the nuclear magnetic longitudinal axis relaxation time of the blood, and k, $C_1$, $C_2$, q are constants.

According to another exemplary embodiment, the calculating unit may calculate the nuclear magnetic longitudinal axis relaxation time $T_1$ of the blood by the following Equation:

$$A'(t) = f_1(R(t), R'(t), q, C_1, C_2, \ldots) + f_2(A(t), T_1, C_3, C_4, \ldots) + g_i,$$

where A(t) is the detected induced signal, A'(t) is a derivative of A(t), R(t) is the detected blood amount, R'(t) is a derivative of R(t), $T_1$ is the nuclear magnetic longitudinal axis relaxation time of the blood, k, q, $C_1$, $C_2$, $C_3$, $C_4$, ... are constants, and $g_i$ is an accidental error.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF EXEMPLARY EMBODIMENTS

Hereinafter, exemplary embodiments of the present invention will be described in detail with reference to the accompanying drawings.

The present invention discloses "NMR molecular dynamic temperature" as a new medical diagnosis factor. This factor is obtained by arithmetically averaging (noninvasively measured) longitudinal axis relaxation time of human blood over a relatively long time (several days or one week). When this factor quickly changes over time, this may be an indication that any histopathological process in the organism is proceeding and a user is required to visit a hospital. A compact NMR relaxometer can initially predict a number of diseases that change protein concentration, a conformation and function of a giant molecule, and a normal path of a normal molecule process within an organism and that are generated at a molecular level. Of course, this means that patients should periodically use the NMR detector. The most commonly significant factor for the NMR detector is temperature. Therefore, this factor is called an "NMR molecular dynamic temperature." Another factor that can be characteristic of metabolism process rate in an organism may be valid time of the longitudinal axis relaxation time reduction after food ingestion or a concentrated physical load. There are several methods for introducing the valid time. For example, the valid time may be a time for the relaxation time to return to its value prior to the food ingestion or physical load. Of course, there are other methods for using a blood relaxation time and an increase or reduction rate of the blood relaxation time in order to represent various factors of a metabolism process in a living organism.

Figure 1:
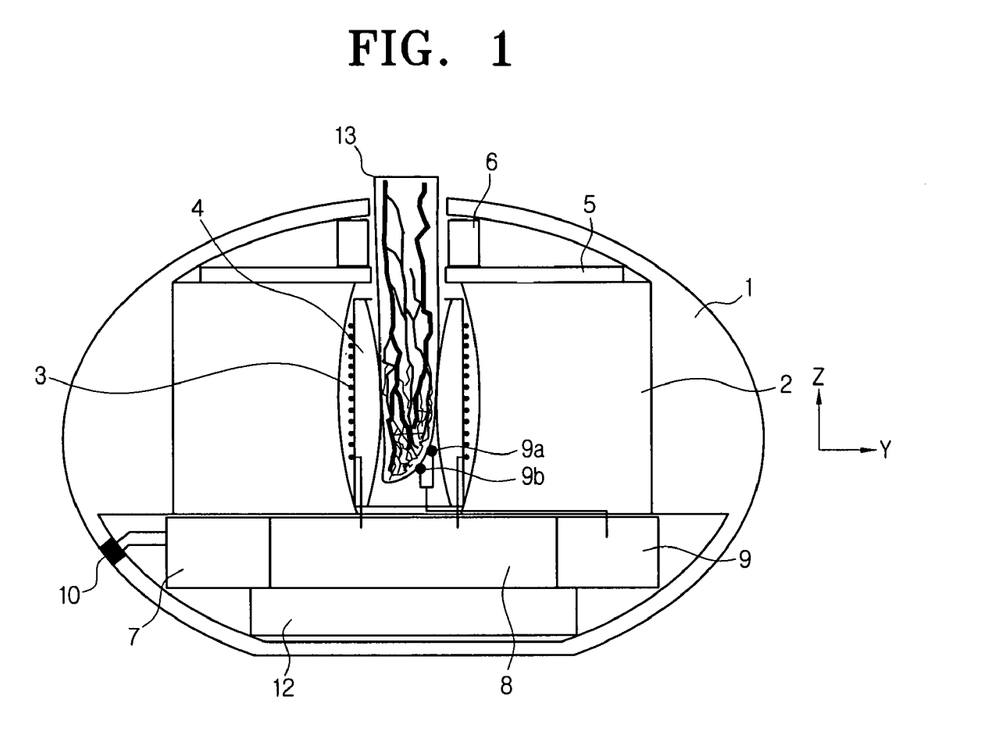
FIG. 1 is a schematic diagram of an apparatus for measuring a nuclear magnetic resonance longitudinal axis relaxation time of blood according to an embodiment of the present invention.

FIG. 1 is a schematic diagram of an apparatus for measuring a NMR longitudinal axis relaxation time of blood according to an embodiment of the present invention.

Referring to FIG. 1, the apparatus comprises a metal body (yoke) 1, a constant magnet 2, a coil 3, an air pumped finger holder, a thermally stabilized resistive element 5, a finger guide 6, a controller 7, a magnetic field supplying unit and induced-signal detector 8, a blood amount detector 9a and 9b, a USB port 10, and a power supply 12.

The metal body 1 can shield a magnetic field generated by the constant magnet 2 or a magnetic field generated by the coil. The metal body 1 has an opening into which the finger 13 may be inserted.

For example, the metal body 1 may be made of steel having a permeability value in the hundreds of thousands. The metal body 1 prevents the magnetic field from flowing outside the apparatus. This is important in actually using the apparatus. The metal body 1 has a conductive surface, which is grounded. To increase a signal to noise ratio, the body 1 should be completely grounded. In an exemplary embodiment, the surface of the metal body 1 is coated with a strong and corrosion-resistive thin metal film having excellent conductivity so that the body 1 is grounded. In an exemplary embodiment, the thin metal film may be a copper film that is coated with thin stainless steel film.

The constant magnet 2 may apply a uniform magnetic field to the finger 13. In an exemplary embodiment, the constant magnet 2 is a rare earth magnet. In another exemplary embodiment, the constant magnet 2 may be made of CoSm or NdFeBr. The constant magnet 2 is positioned within the metal body 1 made of low carbon steel and having reluctance against a magnetic flux.

In this exemplary embodiment, the constant magnet 2 applies the uniform magnetic field in a direction perpendicular to a longitudinal direction of the finger 13. Referring to FIG. 1, the constant magnet 2 has two portions of an N pole and an S pole, in which both ends of the N pole and the S pole are curved to make the magnetic field uniform. In an embodiment, the magnetic field applied by the constant magnet 2 is approximately 0.2 T to 0.3T, with error range being about ±1 gauss (G).

The coil 3 is a kind of inductor that induces a magnetic field when time-variant current flows into the coil 3. The coil is magnetically coupled to a finger 13 to be measured. Preferably, the coil 3 is formed in a shape wound around the finger. The coil is formed so that a user finger tip is accurately inserted into the coil. The coil 3 has a good quality factor because the quality factor significantly affects the accuracy of the apparatus. The quality factor of the coil may be defined by the following Equation:

Quality factor=ω×L÷R,  Equation 4 where, ω is a angular frequency, L is inductance, and R is resistance.

Referring to Equation 4 and according to an exemplary embodiment the coil 3 is may be made of a material having small resistance and great inductance. When the coil is positioned inside a metal shield, the quality factor may be increased.

In this embodiment, there are two currents flowing into the coil 3.

First, current provided by the magnetic field supplying unit and induced-signal detector 8, which is described below, flows into the coil 3. The frequency of the current depends on an NMR resonance condition.

Second, when the magnetic field supplying unit and induced-signal detector 8 supplies and then stops to supply the current to the coil 3, current (electromotive force) induced according to Faraday's law flows into the coil 3.

The first type of current, i.e., the current output from the magnetic field supplying unit and induced-signal detector 8 is supplied to the coil 3, which is magnetically coupled to the finger, to change a magnetization direction of blood in the finger. Preferably, the current flows into the coil 3 so that the blood is magnetized in a different direction (a vertical direction) from the blood magnetization direction determined by the constant magnet 3.

The second type of current, i.e., induced current is reduced in magnitude over time. This induced current is detected by the magnetic field supplying unit and induced-signal detector 8. According to an aspect of the present invention, the NMR longitudinal axis relaxation time $T_1$ can be defined as a time from a time point at which the induced current begins to flow into the coil 3 (application to the first type of coil 3 stops) to a time point at which the magnitude of the induced current approximately reaches zero. Alternately, the NMR longitudinal axis relaxation time $T_1$ may be defined as a time until a magnetization direction determined by the first type of current in the blood is rotated to a direction magnetized by the constant magnet 2.

The finger guide 6 can guide the finger inside the apparatus. For example, the finger guide 6 may be made of plastic or resin in a cylindrical shape according to a finger shape. The finger guide 6 functions to immobilize the finger in cooperation with the air pumped finger holder 4. The air pumped finger holder 4 can immobilize the finger with injected air. The apparatus needs to limit motion since it is applied to an unpredictably shaking and movable living body. Thus, it is important in the present invention to immobilize the finger. A measured change in an amount of the blood due to a non-fixed finger degrades the accuracy of the apparatus.

The magnetic field supplying unit and induced-signal detector 8 generates and supplies current flowing into the coil 3 and detects current induced by the coil 3. While the magnetic field supplying unit and induced-signal detector 8 is shown as one block in FIG. 1 for convenience of illustration, the magnetic field supplying unit and the induced-signal detector perform their respective unique function. That is, the magnetic field supplying unit generates current and applies the current to the coil 3, and the induced-signal detector detects the current induced by the apparatus and the coil 3 and sends the detected current to the controller 7 that will be described below.

The magnetic field supplying unit 8 generates high-frequency current and supplies the current to the coil 3. The high-frequency current has a frequency corresponding to an NMR resonance condition. In one exemplary embodiment, the magnetic field supplying unit 8 generates high-frequency current of 10 to 20 MHz and supplies the current to the coil 3. In another exemplary embodiment, the magnetic field supplying unit 3 generates high-frequency current of 10 to 20 MHz and low-frequency current of for example 5 KHz, multiplies the high-frequency current by the low-frequency current, and supplies a resultant signal to the coil 3. As the high-frequency current multiplied by the low-frequency current is supplied to the coil 3, a signal to noise ratio is increased, as will be described below.

According to an exemplary embodiment of the present invention, the amplitude of the high-frequency current generated by the magnetic field supplying unit 8 is sufficiently small so that a saturation factor Z is much smaller than 1 (Z<<1).

The induced-signal detector 8 can detect a signal (e.g., current) induced in the coil 3 according to Faraday's law. This induced signal is an NMR absorption signal that is proportional to a blood flow rate and an longitudinal axis relaxation rate. This induced signal is induced in the coil 3 when the magnetic field supplying unit 8 supplies current to the coil 3 for a predetermined time and then stops to supply it. The signal induced in the coil 3 reduces in magnitude over time. The induced-signal detector 8 receives the signal induced in the coil 3 and amplifies the signal to send it to the controller 7. When the magnetic field supplying unit 8 applies the high-frequency current multiplied by the low-frequency current to the coil 3, the signal induced in the coil 3 has a frequency having a high-frequency component and a low-frequency component, as well. According this exemplary embodiment, the induced-signal detector 8 filters only the low-frequency component using a low pass filter, amplifies the component, and sends the amplified component to the controller 7.

According to another exemplary embodiment, the induced-signal detector 8 may be implemented by a known apparatus called an NMR absorption sensor. The NMR absorption sensor provides a signal that is proportional to absorption of electromagnetic energy in the electromagnet coil. The amplitude of the signal provided by the NMR absorption sensor depends on the volume of polarized blood flowing into the electromagnet coil and the relaxation time of proton in the blood. Latyshev et al., Garroway et al., Singer et al., Jones et al. and Morse et al. describe the NMR absorption sensor, and are incorporated herein by reference in their entireties. L. F. Latyshev et al. Nuclear Magnetic Resonance in a Flowing Liquid. Moscow: Atomizdat (1968), A. N. Garroway, Velocity Measurements in Flowing Fluids by NMR, Journal of Physics D: Applied Physics, 7: L159 (1974)., J. R. Singer et al., Recent Measurements of Flow Using NMR Techniques, Modern Developments in Flow Measurement, G. C. Clayton, ed., Peter Peregrinus Ltd., London (1972), pp. 38-48., D. W. Jones et al., NMR in Flowing Systems, Advances in Magnetic Resonance, v. 8, J. S. Waugh, ed., Academic Press, N.Y. (1976)., O. C. Morse et al., Blood Velocity Measurements in Intact Subjects, Science, 170, 440 (1970).)

The blood amount detector 9 may detect a blood amount of a finger. In this exemplary embodiment, an amount of the blood flowing into a capillary vessel of the finger is detected. The blood amount detector 9 may be implemented by a known apparatus called a plethysmograph. Typically, the plethysmograph comprises a light emitting element 9a such as an LD and a photo sensitive element 9b for receiving light, as shown in FIG. 1. The plethysmograph may provide a signal that is proportional to the amplitude of blood volume pulsation of a finger. Alternatively, the blood amount detector 9 may be implemented by a waveguide in an electromagnet coil or using a supersonic or electronic impedance principle.

A plethysmograph is disclosed in U.S. Pat. Nos. 6,879,850, 6,763,256, 6,829,496, 6,801,799, 6,714,803, 6,697,658, 6,584,336, and 6,600,940, which are incorporated herein by references in their entirety.

The controller 7 may control initiation and termination of current supply to the coil 3. In this exemplary embodiment, the controller 7 calculates blood NMR longitudinal axis relaxation time based on a signal indicating an blood amount detected by the blood amount detector 9 and the signal detected by the induced-signal detector. In another exemplary embodiment, the controller 7 can calculate the NMR longitudinal axis relaxation time by solving Equation 13 or Equation 14 using a mathematical method such as a regression analysis or partial least square method. In addition, the controller 7 may control functions of all elements of the blood NMR longitudinal axis relaxation time measuring apparatus and perform interface with a user's computer and a zero point adjustment. In another exemplary embodiment, the controller 7 includes a central processing unit (CPU), a program memory, and a data memory. The program memory may store a program that calculates blood NMR longitudinal axis relaxation time based on the blood amount detected by the blood amount detector 9 and the signal detected by the induced-signal detector.

The USB input/output port 10 is used as a communication interface to an external computer. The controller 7 can communicate with the external computer via the USB input/output port 10.

The power supply 12 may supply power to the blood NMR relaxation time measuring apparatus.

Figure 2:
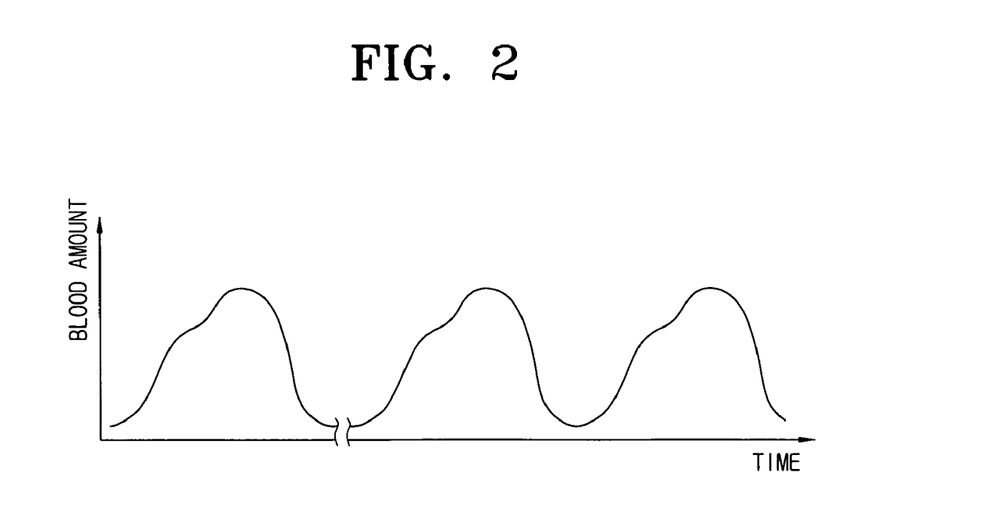
FIG. 2 is a graph illustrating a blood pulsation wave in a capillary vessel.
Figure 3:
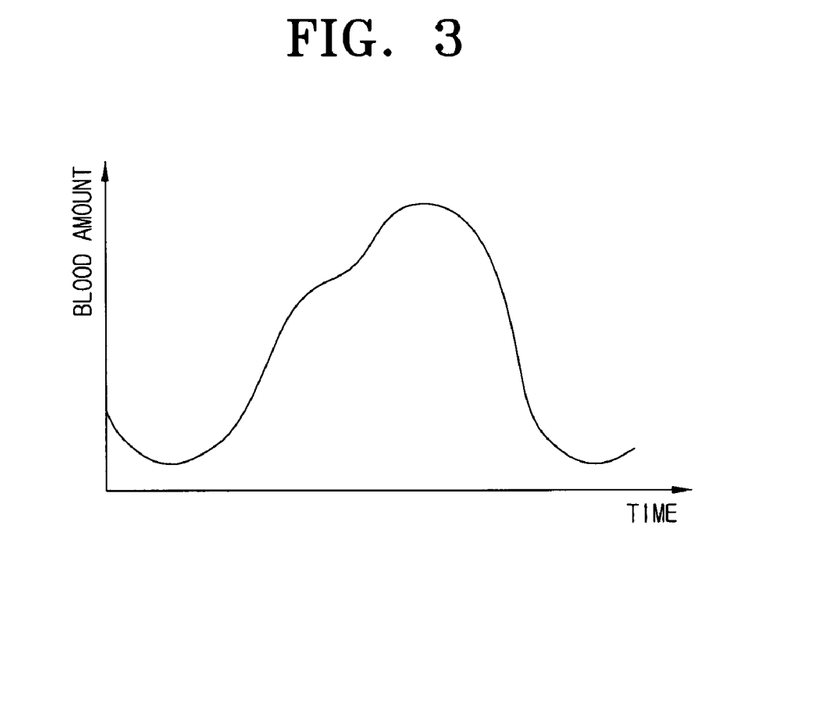
FIG. 3 is a graph illustrating a blood pulsation wave obtained by averaging scores of blood pulsation waves.
Figure 4:
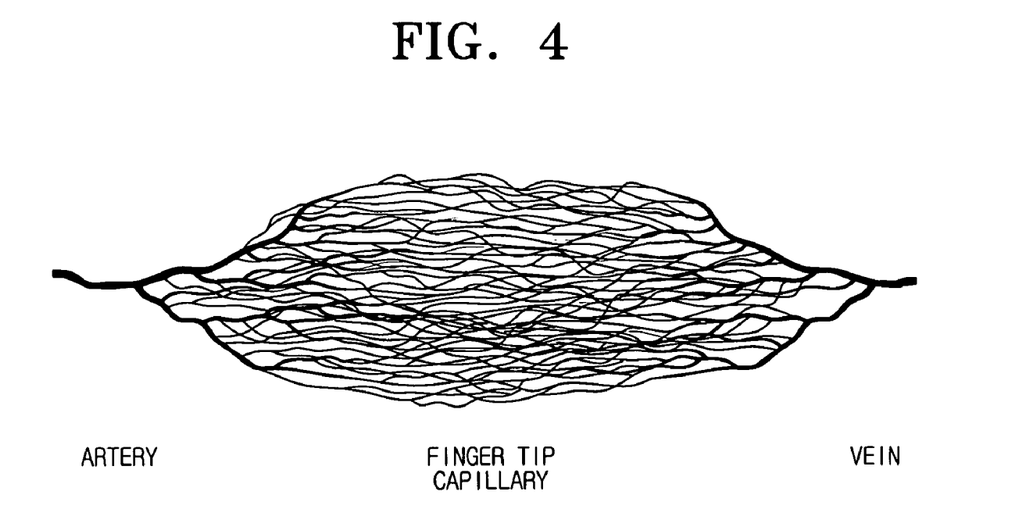
FIG. 4 is a graph illustrating a change in the volume of a capillary vessel during blood pulsation.

FIG. 2 is a graph illustrating a blood pulsation wave in a capillary vessel, FIG. 3 is a graph illustrating a blood pulsation wave obtained by averaging scores of blood pulsation waves, and FIG. 4 is a graph illustrating a change in the volume of a capillary vessel during blood pulsation. FIG. 2 illustrates a signal output from a plethysmograph. The amplitude of this output signal is proportional to relative increase in a volume of blood in the capillary vessel. This fact is illustrated in FIG. 4. Since a capillary vessel wall has elasticity, pulsation energy is partially conserved as potential energy of the capillary vessel wall during the first half of the pulsation wave, and is slowly emitted during the second half of the pulsation. Because of this characteristic, the blood rate is very irregular in the artery but almost uniform in the vein.

It can be seen that the signal often has less irregularity by tracking the plethysmograph signals for pulsation during a number of periods. This is a natural phenomenon and occurs due to several reasons. For example, the reasons include a different physiologic process (e.g., breathing) which has a different period, movement artifact, and uncontrollable muscle convulsion. However, a soft result signal as shown in FIG. 3 can be obtained by collecting plethysmograph signals during pulsation of a number of periods and averaging the signals for one pulsation wave. This signal provides information about heart activity during a certain time and an average blood volume amount of a capillary vessel system of a finger. A time needed to perform the averaging process is normally within one minute.

Figure 5:
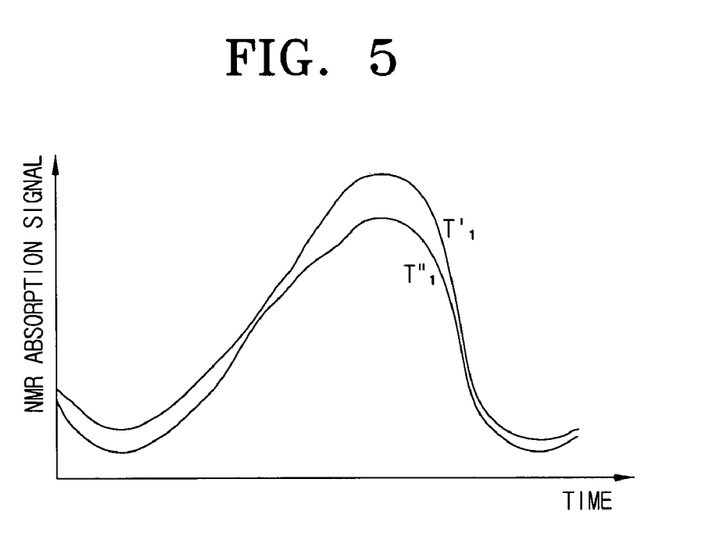
FIG. 5 is a graph illustrating increase in an NMR absorption signal for blood having different longitudinal axis relaxation time in the same blood pulsation wave condition.
Figure 6:
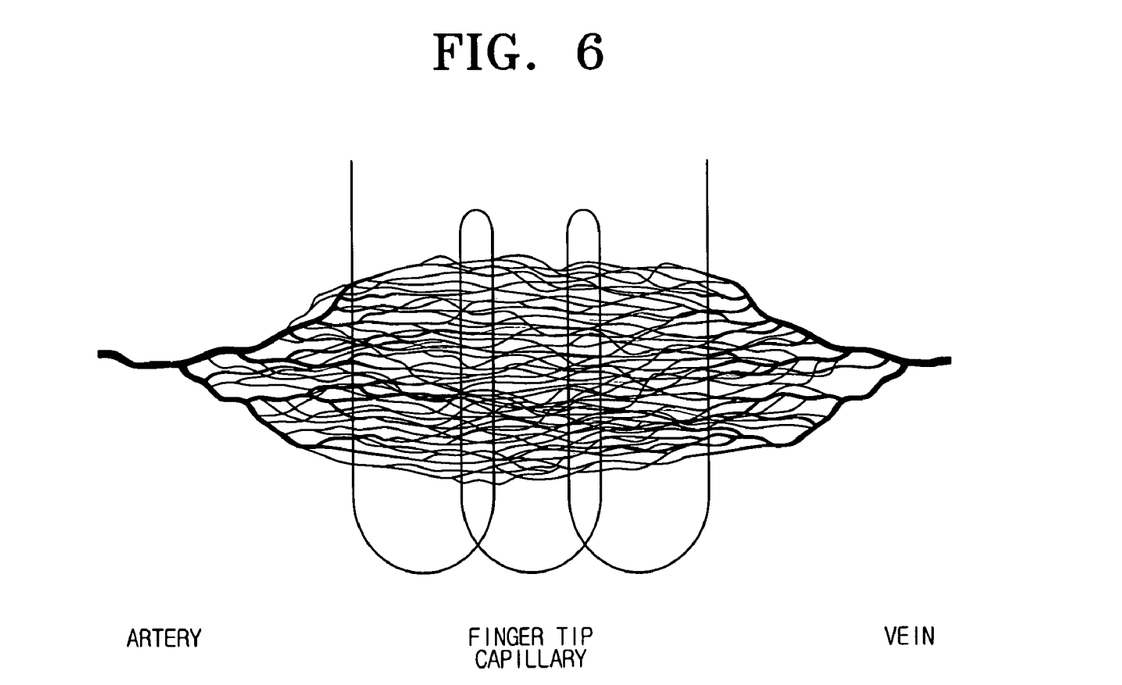
FIG. 6 illustrates the relative position of a high-frequency electromagnet coil to a finger tip capillary vessel.
Figure 7:
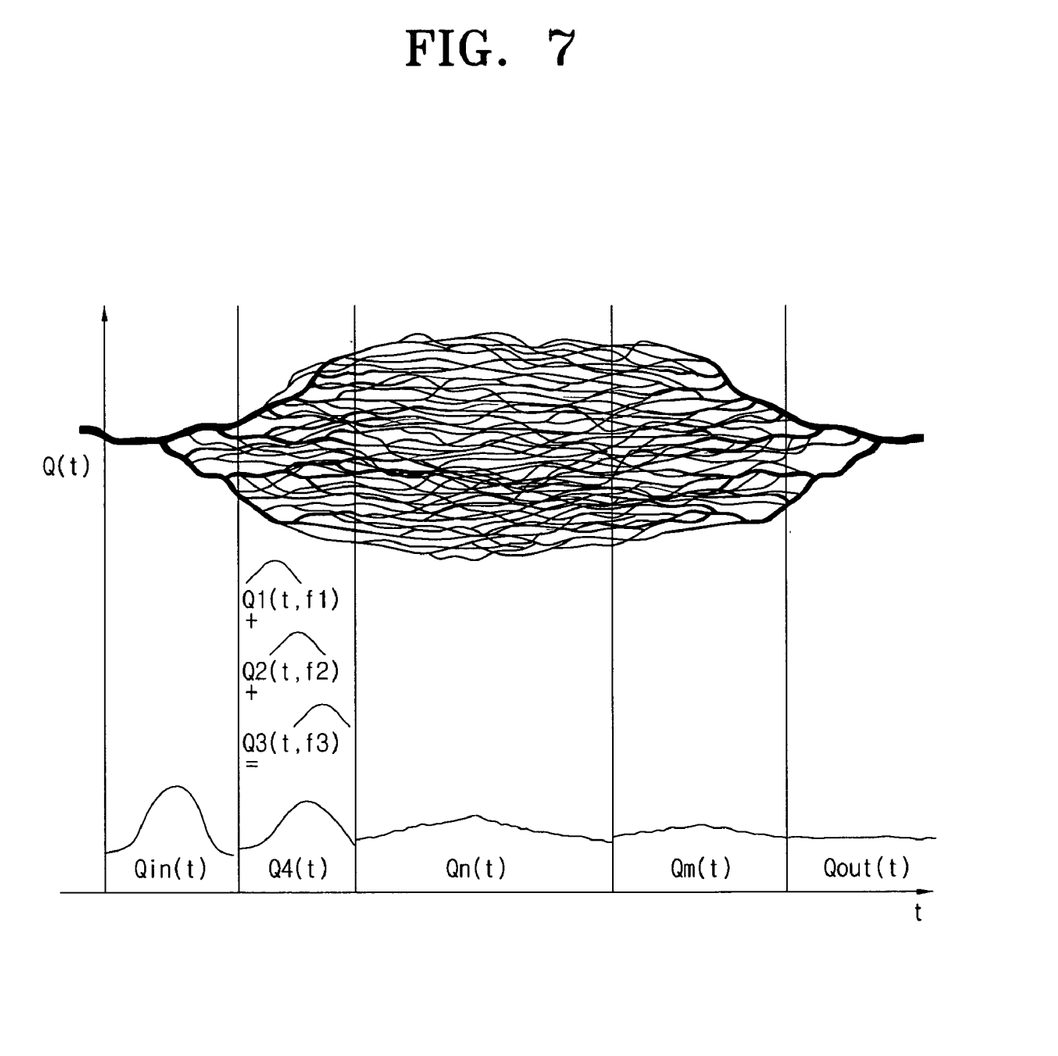
FIG. 7 is a graph illustrating hematocele rate pulsation changed with sectional position of a finger.

FIG. 5 is a graph illustrating an increase in an NMR absorption signal for blood having different longitudinal axis relaxation time in the same blood pulsation wave condition, FIG. 6 illustrates the relative position of a high-frequency electromagnet coil to a finger tip capillary vessel, and FIG. 7 is a graph illustrating hematocele rate pulsation changed with sectional position of a finger.

FIG. 5 shows an average result for a number of pulsations of signals received from an NMR high-frequency coil 3. An NMR absorption signal of an NMR coil depends on two factors of the volume of fresh polarized blood flowing into the coil due to blood pulsation and longitudinal axis relaxation time of proton in blood. This fact is shown in FIG. 5. It was found from observation of the same pulsation waves having the same volume of the blood flowing into a capillary vessel that different absorption signals are obtained if the blood has different longitudinal axis proton relaxation time. A great absorption signal will actually be obtained for a long relaxation time. It will be apparent how the operation of a sensor and signal processing for obtaining only longitudinal axis relaxation time of blood from a relaxation time of a finger tissue is designed. Based on two signals from the NMR coil absorption sensor and the plethysmograph, a processing model can be designed. This model should make it possible to distinguish a contribution of the volume of newly incoming polarized blood to the absorption signal and a contribution of increase in longitudinal axis relaxation time of a blood proton. This can be verified by forming a first approximation model for signal processing.

First, simplification and assumption are required. FIG. 6 shows the structure and position of the artery, vein and capillary vessel of a finger tip relative to a high-frequency (HF) coil. In FIG. 6, the structure of a blood vessel system is illustrated as being straight instead of being curved. This illustration is for convenience of understanding and does not change the nature of a physical phenomenon. The volume of the capillary vessel is changed over time due to blood pressure pulsation. The supply of fresh blood through an inlet of the blood vessel system is a function of time. However, hematocele at an outlet is uniform over time because of the damping nature of the capillary vessel system. Therefore, it is assumed in the first approximation that the blood volume at the finger tip is changed over time only due to the pulsation of fresh artery blood. This approximation is highly accurate. Next, a determination should be made as to whether the magnetization of blood before an inlet of the HF coil 3 is changed over time due to pulsation. The flow velocity of the blood in the capillary vessel changes from 0.1 to 1 mm/s. The flow velocity at a large artery connected to the capillary vessel system may amount to several mm/s. Since a blood supply system is represented by a finger artery, an average hematocele rate at a small blood vessel near the capillary vessel system of the finger tip may be assumed to be a maximum of 5 mm/s. The blood before the finger tip flows into a strong magnetic field of the constant magnet by about 3 cm. The average flow velocity during one pulsation period becomes smaller. It is concluded from this consideration that the blood stays at least 3 seconds in the strong magnetic field before flowing into a space in the HF NMR coil 3. The longitudinal axis proton relaxation time of the blood commonly ranges from 0.5 sec to 0.9 sec. With excellent approximation, when magnetization is equilibrated in a uniform magnetic field, the blood flows into the HF coil 3 at a completely polarized state.

How can the magnetization and flow velocity of the outflow blood be explained? As easily understood, the capillary vessel system is a damping system suitable for the pulsation. The rate of outgoing blood is substantially uniform. An additional equalization element results from the presence of the capillary vessel and the blood vessel having a different diameter near an outlet of the system. They have different flow velocities. Since the flow velocity is very slow in the capillary vessel, the blood takes several seconds to arrive at the outlet through the capillary vessel. Therefore, several pulsation waves simultaneously pass the capillary vessel system. At the outlet, all the pulsation waves have a different phase. All the equalization processes make valid average blood outflow rate substantially uniform over time, as shown in FIG. 7. The same consideration may be applied to magnetization of the outflow blood. The magnetization of the outflow blood is uniform over time because of a slow blood flow rate in the capillary vessel system, a different rate in different capillary vessels, and equalization during several pulsation periods.

Therefore, the magnetization change of polarized blood of the finger tip capillary vessel system in the HF NMR coil 3 is caused by the inflow of fresh polarized blood, the absorption of resonance electromagnetic energy, and a phenomenon that blood proton is relaxed to a magnetization value at the rate of the relaxation time T1 for a natural reason.

The use of this model allows for an approach similar to that presented by Denis and Bene (Denis P., Bene G., Exterman R. Arch. Sci., 5, 32 (1952)). If the flow velocity of the blood flowing into the finger tip capillary vessel system in the HF coil 3 is assumed as a function Q(t), the amount of the blood flowing into the capillary vessel system for dt time will be Q(t)dt. Accordingly, the amount of the blood flowing outside the capillary vessel system is −qdt, where q is a flow velocity constant of the outflow blood. A change in average volume magnetization M of the blood in the sensor due to the inflow of fresh polarized blood and the outflow of relaxed blood can be represented as follows:

$$dM = \frac{M_{in}Q(t)dt - M_{out}qdt}{V(t)}, \quad \text{Equation 5}$$

or $$\frac{dM}{dt} = \frac{M_{in}Q(t)dt - M_{out}q}{V(t)}, \quad \text{Equation 6}$$

where V(t) is a volume of a finger tip capillary vessel system. It is to be noted that the magnetization change caused by resonance absorption is reflected to this equation as a magnetization value $M_{out}$ of the outflow blood.

An average volume magnetization change of the blood within the induced-signal detector due to natural relaxation may be represented by Equation 7:

$$\frac{dM}{dt} = \frac{M_o - M}{T_1} \quad \text{Equation 7}$$

From the previously-described consideration, $M_{in}=M_O$. Combination of Equations 6 and 7 yields Equation 8:

$$\frac{dM}{dt} = \frac{M_o Q(t) - M_{out} q}{V(t)} + \frac{M_o - M}{T_1} \quad \text{Equation 8}$$

In the HF coil 3, the volume change of the finger tip capillary vessel system may be represented as follows:

$$dV = Q(t)dt - qdt \quad \text{Equation 9}$$

or $$Q(t) = V'(t) + q \quad \text{Equation 10}$$

It is to be considered that the NMR coil absorption signal is proportional to the average magnetization value M within the induced-signal detector. The amplitude of the HF energy absorption within the sensor is proportional to M. That is, A∞M. Since $M_O$ and $M_{out}$ are constants, Equation 11 is obtained from Equation 10.

$$A' = \frac{(V'(t) = q)C_1 - qC_2}{V(t)} + \frac{C_1 - A}{T_1}, \quad \text{Equation 11}$$

where $C_1$, $C_2$ and q are constants, and dA(t)/dt and A(t) are known functions. Therefore, unknown constants and factors q and T1 may be determined when the function V(t) is known. This problem may be solved using a plethysmograph sensor signal. Actually, the intensity of light reflected by the capillary vessel system is measured by the plethysmograph sensor. The output signal of the plethysmograph sensor is proportional to a volume change of the finger capillary vessel. Therefore, the capillary vessel system volume may be represented as follows:

$$V(t) = kR(t), \quad \text{Equation 12}$$

where k is a proportional constant and R(t) is a plethysmograph output signal. Finally, the system may be represented by Equation 13.

$$\begin{cases} A'(t) = \frac{(kR'(t) + q)C_1 - qC_2}{kR(t)} + \frac{C_1 - A}{T_1} \\ A(t) \\ A'(t) \\ R(t) \\ R'(t) \end{cases} \text{functions having known value} \quad \text{Equation 13}$$

The constants k, $C_1$ and $C_2$ and factors q and $T_1$ of this system can be derived using a regression analysis method and a partial least square method. It is shown that only the relaxation time of blood can be induced based on two signals from the sensors (the plethysmograph sensor and the NMR absorption sensor) using a simple approach and the first approximation model. The signals are the absorption NMR sensor signal and the plethysmograph sensor signal. For accuracy, the above-described model may be modified. For example, a complex model for a capillary vessel system of the finger tip may be built, and a small difference between a flow rate constant and a magnetization constant of output blood may be considered. As a result, a new point of view for dA(t)/dt is obtained as in Equation 14:

$$A'(t) = f_1(R(t), R'(t), q, C_1, C_2, \ldots) + f_2(A(t), T_1, C_3, C_4, \ldots) + g_i,$$  Equation 14 where $g_i$ is an accidental error. Using this function and output signals of NMR coil 3 and the blood amount detector, an accurate NMR longitudinal axis relaxation time $T_1$ can be obtained. In this exemplary process, a mathematical method such as regression analysis may be used.

Figure 8:
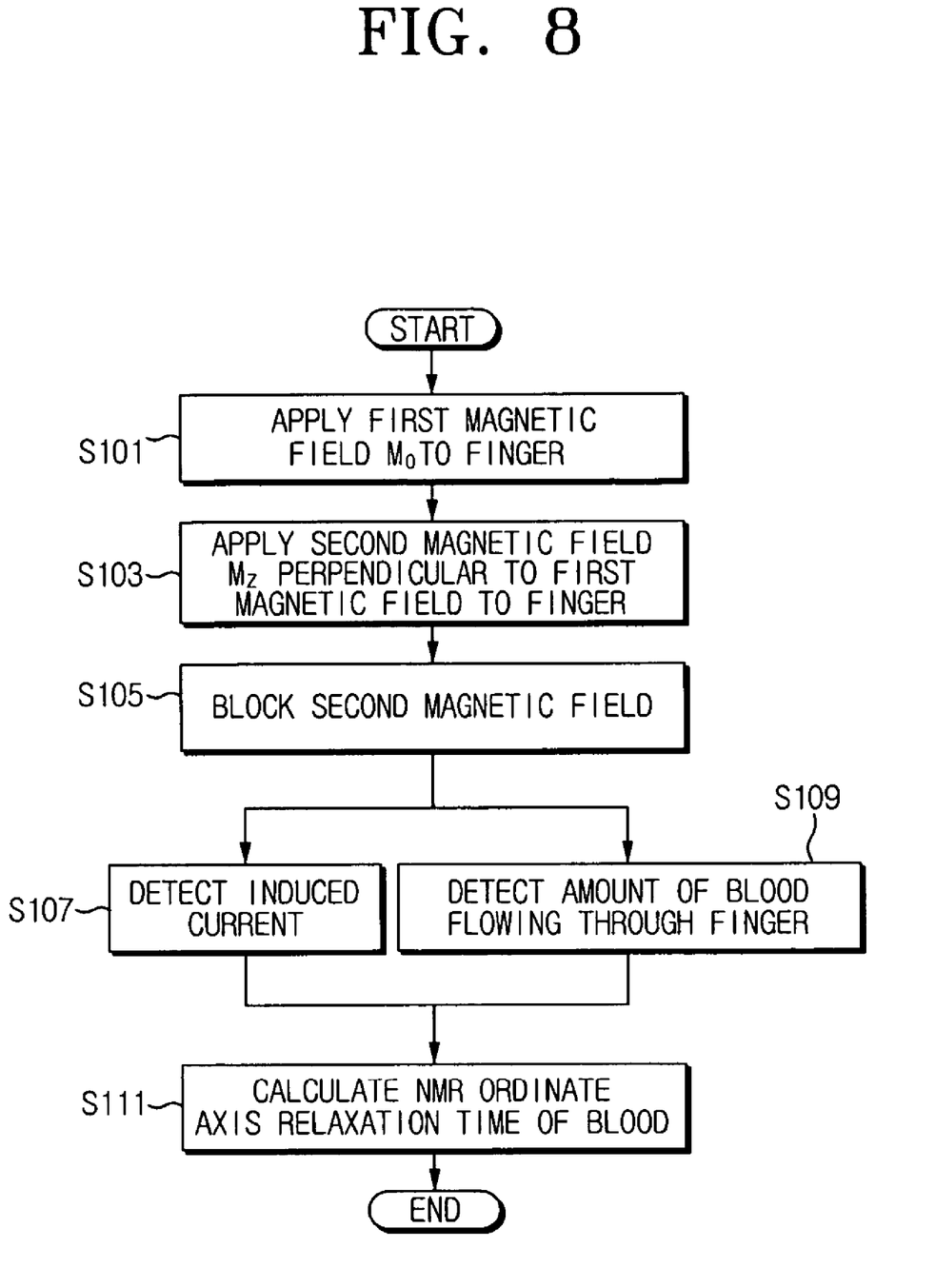
FIG. 8 is a flowchart illustrating a method for measuring a nuclear magnetic resonance longitudinal axis relaxation time of blood according to an embodiment of the present invention.

FIG. 8 is a flowchart illustrating a method for measuring a nuclear magnetic resonance longitudinal axis relaxation time of blood according to an embodiment of the present invention.

A finger 13 is inserted into a coil 3 along a finger guide 6 and fixed by an air pumped finger holder 4.

A constant magnet 2 applies a first magnetic field $M_O$ to the finger (S101). Preferably, the first magnetic field is applied so that a magnetization direction of the blood within the finger becomes uniform to some extent. Referring to FIG. 1, the magnetization direction of the blood magnetized by the constant magnet 2 is a y direction.

After the first magnetic field is applied to the finger, high-frequency current is applied to a coil 3 (S103). The high-frequency current creates a magnetic field. The magnetic field is in a direction perpendicular to the first magnetic field. The magnetic field changes the magnetization direction of some of the blood, which is magnetized toward the y direction by the constant magnet 2, toward a z direction.

The controller 7 then controls a magnetic field supplying unit 8 to block current from being applied to the coil 3 (S105). Current is induced by an electromotive force according to Faraday's law and flows through the coil 3.

The induced-signal detector 8 detects the induced current (S107). This induced current signal is processed by signal processing elements, such as a low pass filter and an amplifier, and then supplied to the controller 7.

A blood amount detector 11 detects an amount of blood flowing through the capillary vessel of the finger (S109). The detected signal is properly processed and then supplied to the controller 7.

The controller 7 calculates an NMR longitudinal axis relaxation time based on the signal from the induced-signal detector 8 and the signal from the blood amount detector 11 (S111). For example, the controller 7 calculates the NMR longitudinal axis relaxation time by solving Equation 13 or 14.

While in the above-described embodiment, the permanent magnet has been used to supply a uniform magnetic field, any type of magnet may be used only if it can supply the uniform magnetic field. For example, an electromagnet that can supply a uniform magnetic field may be used.

While in the above-described exemplary embodiment, the blood amount detector and the induced-signal detector have been described as detecting the current, they may detect a voltage. Any device that can detect a signal indicating a blood amount may be used as the blood amount detector in this exemplary embodiment. A device that can detect an NMR absorption signal may be used as the induced-signal detector according to this exemplary embodiment.

The present invention is applicable to, for example, home diagnostic equipment, recovery process control and metabolism process studies, nutrition ingestion process studies, and sports field studies.

With the method and apparatus according to the present invention, it is possible to more accurately measure an NMR longitudinal axis relaxation time by minimizing the influence of a blood amount.

The foregoing embodiment and advantages are merely exemplary and are not to be construed as limiting the present invention. The present teaching can be readily applied to other types of apparatuses. Also, descriptions of the embodiments of the present invention are exemplary only, intended to be illustrative, and not intended to limit the scope of the claims. Many alternatives, modifications, and variations will be apparent to those skilled in the art.

REFERENCES

1. T. Araki, T. Inouye, T. Motazaki and M. Iio, in Proceedings of the 2 Annual Meeting of the Society of Magnetic Resonance in Medicine (Society of Magnetic Resonance in Medicine, Berkeley, Calif., 1983), pp. 3-4.
2. C. J. G. Bakker and J. Vriend, Phys. Med. Biol. 28, 331 (1983).
3. L. E. Barroilhet and P. R. Moran, Med. Phys. 2, 191, (1975).
4. P. T. Beall, Magn. Reson. Imag. 1, 189, (1982).
5. P. T. Beall, B. B. Asch, D. C. Chang, D. Medina, C. F. Hazlewood, J. Natl. Cancer Inst. 64, 335 (1980).
6. P. S. Belton, R. R. Jackson, K. J. Packer. Biochim. Biophys. Acta. 286, 16 (1972).
7. D. R. Bailes, I. R. Young, D. J. Thomas, K. Straughan, G. M. Bydder, R. E. Steiner, Clin. Radiolog. 33, 395 (1982).
8. E. Odelblad, G. Lindstrom, Acta Radiol. 43, 469 (1955).
9. E. Odelblad, U. Bryhn, Acta Radiiol. 47, 315 (1957).
10. E. Odelblad, B. Westin, Acta Radiol. 49, 389, (1958).
11. R. Damadian, Science 171, 1151 (1971).
12. J. C. Eggleston, L. A. Saryan, D. P. Hollis, Cancer Res. 35, 1326 (1975).
13. P. A. Bottomley. T. H. Foster, R. E. Argersinger, L. M. Pfeifer, Med. Phys. 11 (4), July/August 1984.
14. G. B. Friedmann, Magnetic Resonance Review 6, 4, 247-307 (1981).
15. P. A. bottomley, C. J. Hardy, R. E. Argersinger, G. Allen-Moore, Medical Physics 14, no. 1, 1-37, January ?February 1987.
16. J. L. Leviel, J. F. le Bas, M. Decorps, A. L. Benabid, Journal de Biophysique & Medecine Nucleaire v. 7, no. 5, 161-169, 1983.
17. E. A. Papish, T. Y. Tyomkina, N. F. Karyakina, Meditsinskaya Radiologiya vol.33, no.8: 47-50, August 1988.
18. O. P. Revokatov, M. G. Gangardt, V. V. Murashko, A. K. Zhuravlev, Biofizika v.27, no 2, 336-338, 1982.
19. A. Koivula, K. Suominen, T. Timonen, K. Kiviniitty, Physics in Medicine and Biology v. 27, no. 7, 937-947, July 1982.
20. M. Sogami, N. Uyesaka, S. Era, and K. Kato. NMR in Biomedicene, 16, 19-28, 2003.
21. Denis P., Bene G., Exterman R. Arch. Sci., 5, 32 (1952).
22. Hinshaw et al. Display of Cross-Sectional Anatomy by Nuclear Magnetic Resonance Imaging. Brit. J. Radiol., 51: 273 (1978).
23. Edelstein et al. Spin Warp NMR Imaging and Applications to Human Whole-Body Imaging. Phys. Med. Biol., 25(4): 751-6 (1980).
24. Crooks et al. Nuclear Magnetic Resonance Whole-Body Imager Operating at 3.5 kGauss. Radiology, 143(1): 169-174 (1982).

25. Protasov E. A., Esikov O. S., Karpova E. S. Measurement of concentration of glucose in human blood by NMR method. Scientific conf. MEPhI-2003, v. 5, p. 38.
26. Esicov O. S., Protasov E. A. Magneto-resonant method of measurement of spin-lattice relaxation time on the base of the size of absorption signal. Scientific conf. MEPhI-2003, v. 4, p. 46.
27. L. F. Latyshev et al. Nuclear Magnetic Resonance in a Flowing Liquid. Moscow: Atomizdat (1968).
28. A. N. Garroway, Velocity Measurements in Flowing Fluids by NMR, Journal of Physics D: Applied Physics, 7: L159 (1974).
29. J. R. Singer et al., Recent Measurements of Flow Using NMR Techniques, Modem Developments in Flow Measurement, G. C. Clayton, ed., Peter Peregrinus Ltd., London (1972), pp. 38-48.
30. D. W. Jones et al., NMR in Flowing Systems, Advances in Magnetic Resonance, v.8, J. S. Waugh, ed., Academic Press, N.Y. (1976).
31. O. C. Morse et al., Blood Velocity Measurements in Intact Subjects, cience, 170,440 (1970).

What is claimed is:

1. A method for measuring nuclear magnetic resonance (NMR) longitudinal axis relaxation time $T_1$ of blood, the method comprising:
applying a first magnetic field $M_O$ to a living body portion into which the blood flows in order to magnetize the blood in a first direction;
applying a second magnetic field $M_Z$ to at least a portion of the living body portion, to which the first magnetic field $M_O$ is applied, in order to magnetize at least a portion of the blood that flows in the first direction, in a second direction vertical to the first direction;
controlling application of the second magnetic field $M_Z$;
blocking the second magnetic field $M_Z$;
when the second magnetic field $M_Z$ is blocked, detecting a signal that is induced as magnetization is returned from the second direction to the first direction;
detecting an amount of the blood flowing into the living body portion to which the second magnetic field $M_Z$ is applied; and
calculating the longitudinal axis relaxation time $T_1$ of the blood based on the induced signal and based on the blood amount to which the second magnetic $M_Z$ field is applied to reduce an influence of the blood amount on the longitudinal axis relaxation time of the blood.

2. The method as claimed in claim 1, further comprising immobilizing the living body portion to prevent movement thereof.

3. The method as claimed in claim 1, wherein the nuclear magnetic resonance is hydrogen nuclear magnetic resonance (H NMR).

4. The method as claimed in claim 1, wherein applying the second magnetic field $M_Z$ comprises of:
generating high-frequency current;
generating low-frequency current;
multiplying the generated high-frequency current by the low-frequency current; and
supplying the resultant current to a coil, the coil being magnetically connected with a living body portion to which the second magnetic field is to be applied, and wherein:
the controlling controls application of current to the coil,
the detecting the induced signal comprises filtering a signal induced from the coil to obtain a low-frequency component signal, and amplifying the obtained low-frequency component signal, and
the amplified signal is used as the induced signal that is used in calculating the longitudinal axis relaxation time $T_1$ of the blood.

5. The method as claimed in claim 4, the controlling further comprises controlling the frequency of the high-frequency current and the low-frequency current.

6. The method as claimed in claim 1, wherein the living body portion is a finger of a human body.

7. The method as claimed in claim 6, wherein the blood amount is an amount of blood flowing into a capillary vessel system of the finger tip.

8. The method as claimed in claim 7, wherein the calculating the NMR longitudinal axis relaxation time $T_1$ of the blood calculates the nuclear magnetic longitudinal axis relaxation time $T_1$ of the blood by the following equation:

$$A'(t) = \frac{(kR'(t)+q)C_1 - qC_2}{kR(t)} + \frac{C_1 - A}{T_1},$$

where A(t) is the detected induced signal, A'(t) is a derivative of A(t), R(t) is the detected blood amount, R'(t) is a derivative of R(t), $T_1$ is the NMR longitudinal axis relaxation time of the blood, and k, $C_1$, $C_2$, q are constants.

9. The method as claimed in claim 7, wherein the calculating the NMR longitudinal axis relaxation time $T_1$ of the blood calculates the NMR longitudinal axis relaxation time $T_1$ of the blood by the following equation:

$$A'(t) = f_1(R(t), R'(t), q, C_1, C_2, \ldots) + f_2(A(t), T_1, C_3, C_4, \ldots) + g_i,$$

where A(t) is the detected induced signal, A'(t) is a derivative of A(t), R(t) is the detected blood amount, R'(t) is a derivative of R(t), $T_1$ is the NMR longitudinal axis relaxation time of the blood, k, q, $C_1$, $C_2$, $C_3$, and $C_4$ ... are constants, and $g_i$ is an accidental error.

10. An apparatus for measuring nuclear magnetic resonance (NMR) longitudinal axis relaxation time $T_1$ of blood, the apparatus comprising:
a first magnetic field $M_O$ supplying unit for applying a first magnetic field $M_O$ to a living body portion into which the blood flows in order to magnetize the blood in a first direction;
a second magnetic field supplying unit for applying a second magnetic field $M_Z$ to at least a portion of the living body portion, to which the first magnetic field $M_o$ is applied, in order to magnetize at least a portion of the blood that flows in the first direction, in a second direction vertical to the first direction;
a controller configured to control application of the second magnetic field $M_Z$;
an induced-signal detector configured to, when the second magnetic field $M_Z$ is blocked, detect a signal that is induced as magnetization is returned from the second direction to the first direction;
a blood amount detector configured to detect an amount of the blood flowing into the living body portion to which the second magnetic field $M_Z$ is applied; and
a calculating unit configured to calculate the longitudinal axis relaxation time $T_1$ of the blood based on the induced signal and the blood amount to reduce an influence of the blood amount on the longitudinal axis relaxation time of the blood.

11. The apparatus as claimed in claim 10, further comprising an immobilization unit configured to immobilize the living body to prevent movement of thereof.

12. The apparatus as claimed in claim 11, wherein the immobilization unit comprises a guide configured to guide the finger and an air pumped finger holder for immobilizing a tip of the finger.

13. The apparatus as claimed in claim 10, wherein the second magnetic field $M_z$ supplying unit comprises a high-frequency current generator, a low-frequency current generator, and a multiplier for multiplying the generated high-frequency current by the low-frequency current, the coil receives a signal from the multiplier to generate the second magnetic field, the controller controls application of current to the coil, the induced-signal detector comprises a low pass filter configured to receive an induced signal from the coil and filtering the induced signal to obtain a low-frequency component signal, and an amplifier configured to amplify the detected low-frequency component signal; and wherein, an output signal from the amplifier is input to the calculating unit calculating the longitudinal axis relaxation time $T_1$ of the blood.

14. The apparatus as claimed in claim 10, wherein the living body portion is a finger of a human body.

15. The apparatus as claimed in claim 14, wherein the blood amount is an amount of blood flowing into a capillary vessel system of the finger tip.

16. The apparatus as claimed in claim 15, wherein the calculating unit calculates the nuclear magnetic longitudinal axis relaxation time $T_1$ of the blood by the following equation:

$$A'(t) = \frac{(kR'(t)+q)C_1 - qC_2}{kR(t)} + \frac{C_1 - A}{T_1},$$

where A(t) is the detected induced signal, A'(t) is a derivative of A(t), R(t) is the detected blood amount, R'(t) is a derivative of R(t), $T_1$ is the nuclear magnetic longitudinal axis relaxation time of the blood, and k, $C_1$, $C_2$, q are constants.

17. The apparatus as claimed in claim 15, wherein the calculating unit calculates the nuclear magnetic longitudinal axis relaxation time $T_1$ of the blood by the following equation:

$$A'(t) = f_1(R(t),R'(t),q,C_1,C_2, \ldots ) + f_2(A(t),T_1,C_3,C_4,\ldots) + g_i,$$

where A(t) is the detected induced signal, A'(t) is a derivative of A(t), R(t) is the detected blood amount, R'(t) is a derivative of R(t), $T_1$ is the nuclear magnetic longitudinal axis relaxation time of the blood, k, q, $C_1$, $C_2$, $C_3$, and $C_4$ ... are constants, and $g_i$ is an accidental error.

* * * * *